(12) United States Patent
Hsieh et al.

(10) Patent No.: US 11,322,645 B1
(45) Date of Patent: May 3, 2022

(54) ELECTRONIC DEVICE AND MANUFACTURING METHOD THEREOF

(71) Applicant: Innolux Corporation, Miao-Li County (TW)

(72) Inventors: Tsau-Hua Hsieh, Miao-Li County (TW); Jian-Jung Shih, Miao-Li County (TW); Tzu-Min Yan, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 4 days.

(21) Appl. No.: 16/853,735

(22) Filed: Apr. 20, 2020

Related U.S. Application Data

(60) Provisional application No. 62/852,312, filed on May 24, 2019.

(51) Int. Cl.
*H01L 21/00* (2006.01)
*H01L 33/00* (2010.01)
*H01L 25/075* (2006.01)

(52) U.S. Cl.
CPC ...... *H01L 33/0095* (2013.01); *H01L 25/0753* (2013.01); *H01L 33/0093* (2020.05); *H01L 2933/0016* (2013.01)

(58) Field of Classification Search
CPC ............ H01L 33/0095; H01L 33/0093; H01L 25/0753; H01L 2933/0016
See application file for complete search history.

(56) References Cited

U.S. PATENT DOCUMENTS

| | | | |
|---|---|---|---|
| 2009/0224275 A1* | 9/2009 | Chan | H01L 33/38 257/98 |
| 2013/0168708 A1* | 7/2013 | Shibata | H01L 24/75 257/88 |
| 2019/0128951 A1 | 5/2019 | Tu et al. | |
| 2019/0325790 A1* | 10/2019 | Park | H01L 33/0095 |
| 2020/0184859 A1* | 6/2020 | Park | H01L 33/44 |
| 2020/0203321 A1* | 6/2020 | Choi | H01L 25/167 |
| 2020/0251608 A1* | 8/2020 | Cho | H01L 33/0016 |
| 2020/0279826 A1* | 9/2020 | Cho | H01L 25/0753 |
| 2020/0303592 A1* | 9/2020 | Kim | H01L 33/0095 |
| 2020/0328198 A1* | 10/2020 | Takeya | H01L 25/167 |
| 2021/0175387 A1* | 6/2021 | Ting | H01L 24/95 |
| 2021/0202808 A1* | 7/2021 | Hayashi | H01L 33/60 |

* cited by examiner

Primary Examiner — Ismail A Muse
(74) Attorney, Agent, or Firm — JCIPRNET

(57) ABSTRACT

The disclosure discloses a method for manufacturing light-emitting diode (LED) chips. The manufacturing method includes: providing a plurality of LED elements; randomly mixing the plurality of LED elements; performing a mesa process on the plurality of LED elements; and forming at least one pair of electrodes on the plurality of LED elements. An electronic device includes the LED chips.

18 Claims, 18 Drawing Sheets

ELECTRONIC DEVICE AND MANUFACTURING METHOD THEREOF

CROSS-REFERENCE TO RELATED APPLICATION

This application claims the priority benefit of U.S. provisional application Ser. No. 62/852,312, filed on May 24, 2019. The entirety of the above-mentioned patent application is hereby incorporated by reference herein and made a part of this specification.

BACKGROUND OF THE INVENTION

1. Field of the Invention

The disclosure relates to a manufacturing method of an electronic device, and in particular, to a method of manufacturing LED chips.

2. Description of Related Art

As an electronic device, a display has been widely applied in various aspects of life, for example, in a smartphone, a tablet computer, and a television.

Because of some tiny differences in the manufacturing process, position, parameters, or some other factors, the LED chips used in a display may be uneven in properties. Therefore, some defects such as a mura phenomenon caused by uneven properties may appear when a display is displaying images.

When the LED chips are manufactured, how to reduce the defects due to the uneven properties between LED chips is one of problems that need to be improved.

SUMMARY OF THE INVENTION

The disclosure provides a method for manufacturing LED chips, which may, for example, mix a plurality of LED elements of a small size, to reduce uneven properties.

In an embodiment, the disclosure provides a method for manufacturing LED chips. The manufacturing method includes: providing a plurality of LED elements; randomly mixing the plurality of LED elements; performing a mesa process on the plurality of LED elements; and forming at least one pair of electrodes on the plurality of LED elements.

In an embodiment, the disclosure provides a method for manufacturing an electronic device. The manufacturing method includes: providing a growth substrate; forming an epitaxial layer with a stack structure on the substrate; dividing the epitaxial layer into a plurality of LED elements; separating the plurality of LED elements from the growth substrate; randomly mixing the plurality of LED elements; performing a mesa process on the plurality of LED elements; and forming a plurality of electrodes on the plurality of LED elements to form at least one LED chip, and placing the at least one LED chip on a driving substrate.

For a better understanding of the aforementioned and other aspects of the disclosure, the following gives a detailed description of embodiments with reference to accompanying drawings.

DESCRIPTION OF THE EMBODIMENTS

Figure 1A:
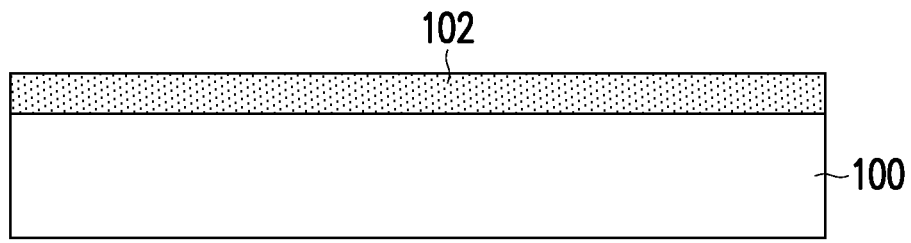
FIG. 1A to FIG. 1N are schematic cross-sectional structural diagrams of a process of manufacturing LED chips and an electronic device according to an embodiment of the disclosure.

In this specification, some embodiments of the disclosure are described with reference to the accompanying drawings. Actually, these embodiments may have different variants, and the disclosure is not limited to the embodiments in this specification. The same reference numerals in the accompanying drawings are only used to indicate the same or similar components.

The disclosure may be understood with reference to the following detailed description and the accompanying drawings. It should be noted that, for ease of understanding, a plurality of drawings in the disclosure show only a part of an electronic device, and specific components in the drawings are not drawn to scale. In addition, the quantity and size of the components in the drawings are merely exemplary, and are not intended to limit the scope of the disclosure.

Some words are used to refer to specific components in the whole specification and the appended claims in the disclosure. A person skilled in the art should understand that an electronic device manufacturer may use different names to refer to the same components. This specification is not intended to distinguish components that have the same functions but different names. In this specification and the claims, words such as "include", "comprise", and "have" are open words, and should be interpreted as "including, but not limited to". Therefore, when the terms "include", "comprise", and/or "have" are used in the description of the disclosure, the presence of corresponding features, regions, steps, operations and/or elements is specified without excluding the presence of one or more other features, regions, steps, operations and/or elements.

The directional terms mentioned herein, like "above", "below", "front", "back", "left", and "right", refer to the directions in the accompanying drawings. Therefore, the directional terms are only used for illustration instead of limiting the disclosure. In the accompanying drawings, common features of a method, a structure and/or a material used in a specific embodiment are shown in the drawings. However, these drawings should not be construed as defining or limiting the scope or nature of these embodiments. For example, the relative sizes, thicknesses and positions of films, regions and/or structures may be reduced or enlarged for clarity.

When a corresponding element such as a film or a region is referred to as being "on another element", it may be directly on the another element, or there may be other elements between the two elements. In another aspect, when an element is referred to as being "directly on another element", there is no element between the two elements. In addition, when an element is referred to as being "on another element", the two elements have an up and down relationship in a top view. The element may be located above or below the another element, and the spatial relationship depends on the orientation of the device.

It should be understood that, when an element or a film is referred to as being "connected to" another element or film, it may be directly connected to the another element or film, or there are elements or films inserted between the two elements or films. When an element or a film is referred to as being "directly connected to" another element or film, there is no element or film inserted between the two elements or films. In addition, when an element is referred to as being "coupled to another element (or a variant thereof)", it may be directly connected to the another element, or may be indirectly connected to (for example, electrically connected to) the another element through one or more elements.

Ordinal numbers used in this specification and the claims, like "first" and "second", are used to modify the components, and do not imply or represent that the (or these) component (or components) has (or have) any ordinal number, and do not indicate any order between a component and another component, or an order in a manufacturing method. These ordinal numbers are merely used to clearly distinguish a component having a name with another component having the same name. Different terms may be used in the claims and the specification, so that a first element in the specification may be a second element in the claims.

In the disclosure, an electronic device may include, but not limited to, a display device, a light-emitting device, other suitable electronic devices, or a combination of the foregoing devices.

The following describes the technology of the disclosure by using some embodiments. However, the disclosure is not limited to the described embodiments, and possible combinations of the embodiments are allowed.

In the disclosure, after manufactured, LED elements with an epitaxial structure are randomly mixed. Then, the LED elements are disposed on predetermined locations, to perform a subsequent process of manufacturing LED chips. Although some LED elements may have worse light-emitting performance due to the uneven properties, the LED elements may be evenly distributed on a substrate due to the random mixing. The mixing mechanism in the disclosure is easily performed on LED elements of a relatively small size, and it is better to mix the LED elements before the subsequent processes such as a mesa process and a process of forming electrodes. Because that it is difficult to perform mixing when the mesa process and the process of forming electrodes are completed. The disclosure can effectively reduce such difficulty. It should be noted that in the disclosure, the term "LED" may include, but not limited to, an organic light-emitting diode (OLED), an inorganic light-emitting diode (LED), a micro light-emitting diode (micro-LED) or a mini light-emitting diode (mini-LED), a quantum dot light-emitting diode (QLED or QDLED), or other suitable type of light emitting diodes.

Figure 1B:
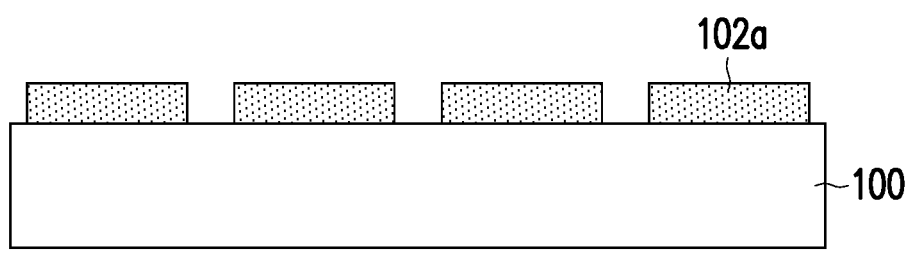
Figure 1C:
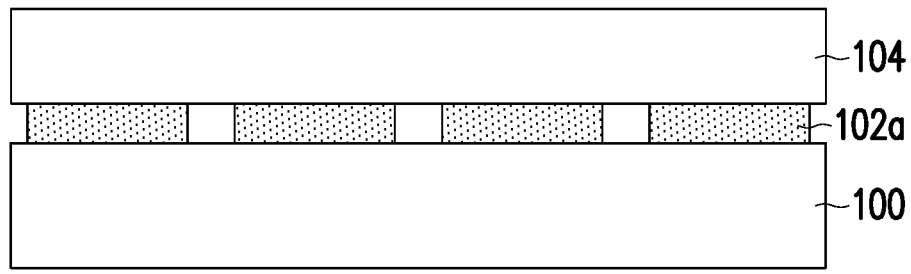
Figure 1D:
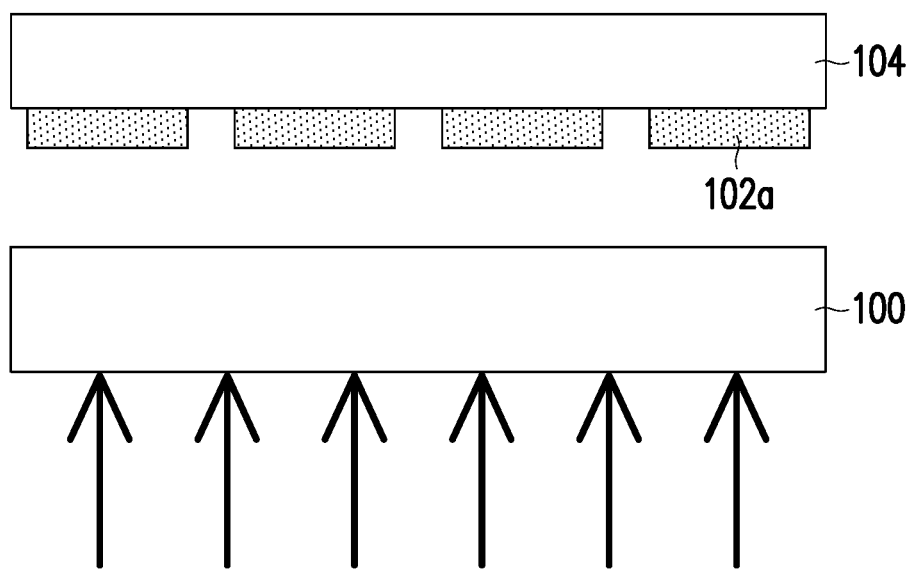
Figure 1E:
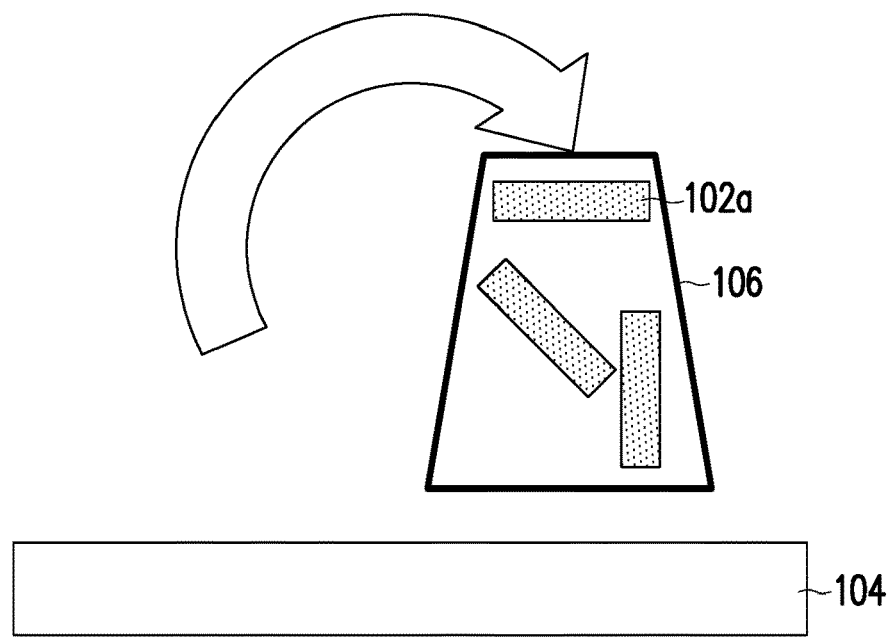
Figure 1F:
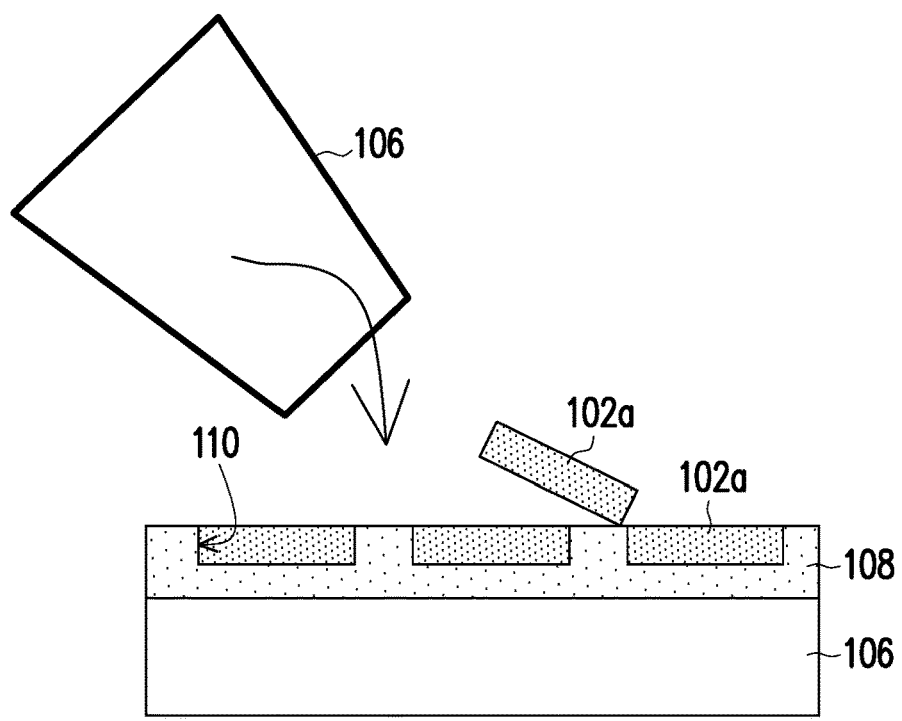
Figure 1G:
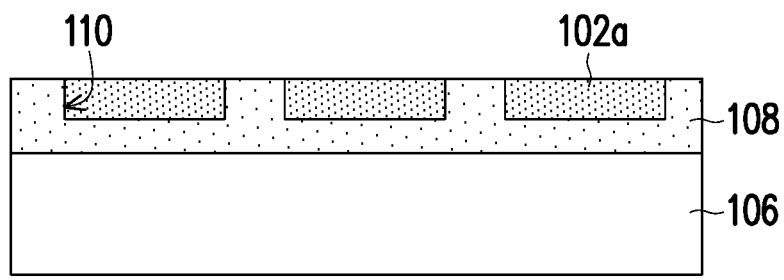
Figure 1H:
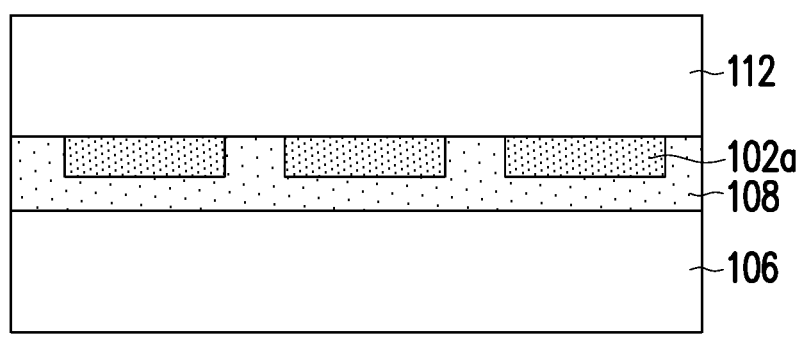
Figure 1I:
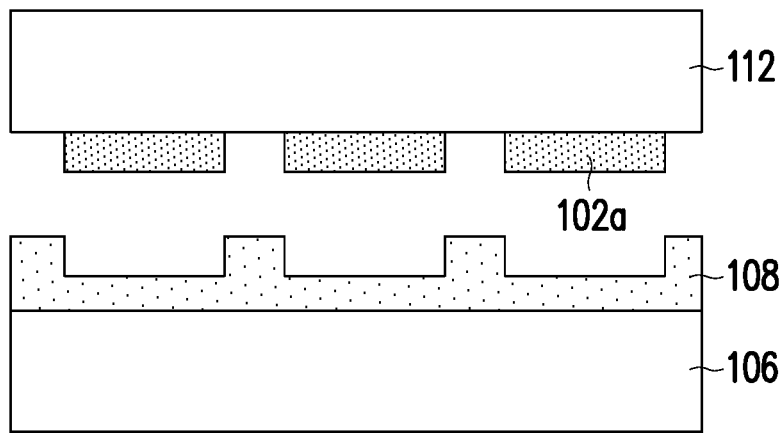
Figure 1J:
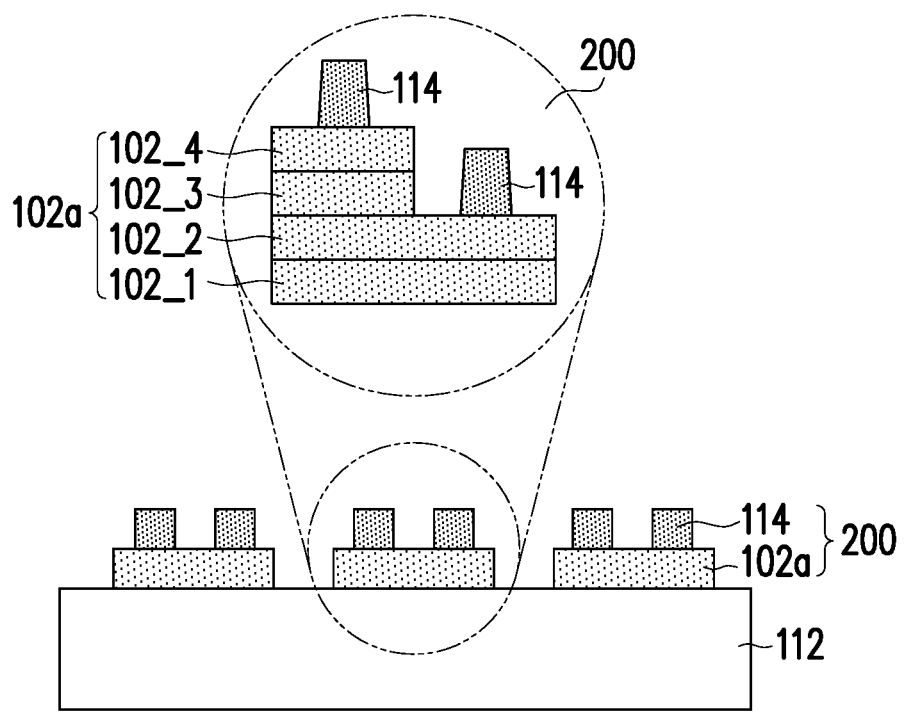
Figure 1K:
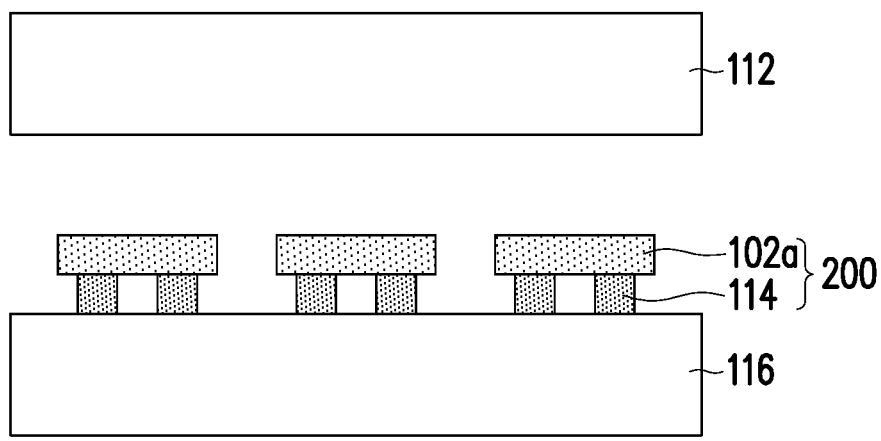
Figure 1L:
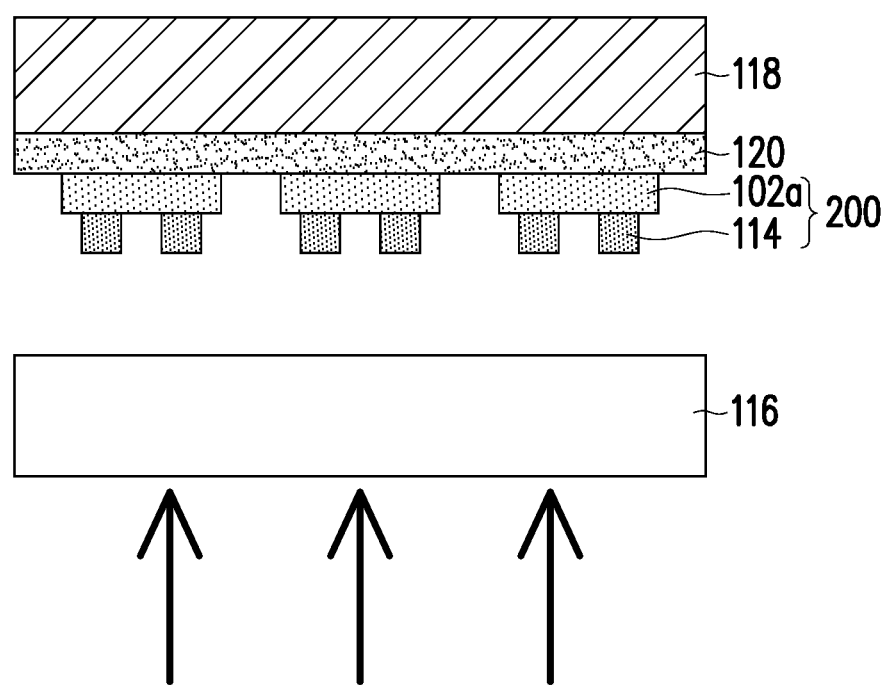
Figure 1M:
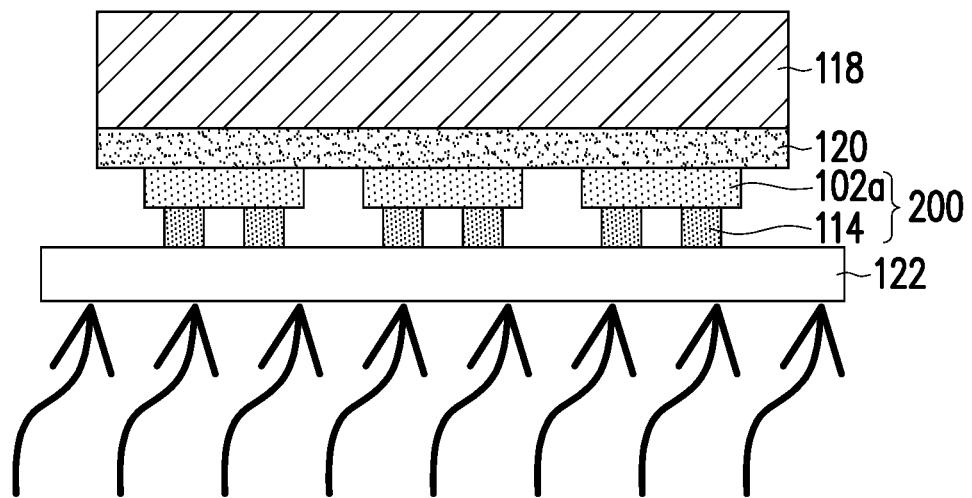
Figure 1N:
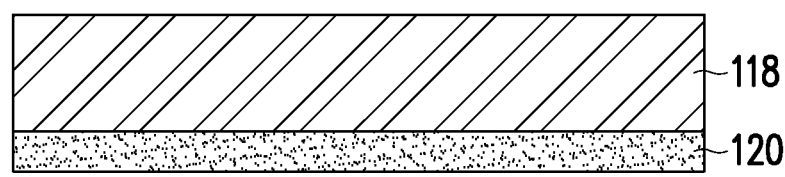
Figure 1N:
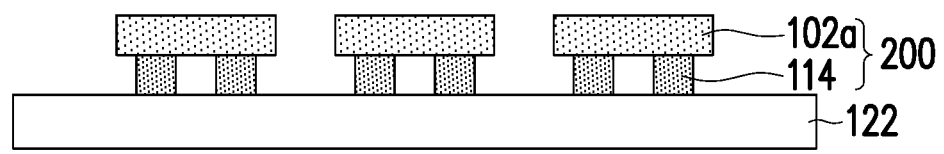

FIG. 1 A to FIG. 1N are schematic cross-sectional structural diagrams of a process of manufacturing LED chips and an electronic device according to an embodiment of the disclosure.

Referring to FIG. 1A, an epitaxial layer 102 is formed on a provided growth substrate 100. The growth substrate 100, for example, may be a glass substrate, a sapphire substrate, or other materials having similar properties, and is used to form the epitaxial layer 102 thereon. Herein, the epitaxial layer 102 is a semiconductor stack structure, to be more specific, a semiconductor stack structure including an N-type layer and a P-type layer, and a multiple quantum well (MQW) located between the N-type layer and the P-type layer. The epitaxial layer 102 is an initial layer that LED elements are not yet defined.

Herein, it should be noted that, the properties of the epitaxial layer 102 may be uneven. That is, the local properties of the epitaxial layer 102 may be different in different locations of the epitaxial layer 102.

Referring to FIG. 1B, the epitaxial layer 102 is divided into a plurality of separated LED elements 102a on the growth substrate 100. Due to the uneven properties of the epitaxial layer 102, the performance, such as luminance, of the plurality of LED elements 102a may be uneven.

Referring to FIG. 1C, the LED elements 102a on the growth substrate 100 are bonded with a carrier substrate 104, by using adhesive such as epoxy, silicone, acrylic, siloxane, photoresists, heat curing materials, other suitable materials, or the combination thereof (not shown).

Referring to FIG. 1D, the LED elements 102a may be separated from the growth substrate 100, for example, by heating a surface of the growth substrate 100 far away from the LED elements 102a, but the disclosure is not limited thereto, in some embodiment, the LED elements 102a may be separated in a wet etching process or a laser removing process (e.g. a laser lift off process). In this case, the LED elements 102a are adhered to the carrier substrate 104.

Referring to FIG. 1E, the plurality of LED elements 102a on the carrier 104 are moved into a mixing device 106, then the LED elements are randomly mixed. In other words, LED elements 102a with different levels of properties may be evenly distributed after random mixing, rather than that the LED elements with a certain level of property are concentrated at a certain region.

The LED elements 102a may be removed from the carrier 104, for example, in a chemical process, a laser removing process, or a heating process. However, the disclosure is not limited thereto. The plurality of LED elements 102a are mixed in the mixing device 106. The mixing device 106 may be, for example, a container containing a liquid, but the disclosure is not limited thereto. The LED elements 102a may be mixed by vibrating or rolling the mixing device 106, but the disclosure is not limited to a specific mixing mechanism.

Referring to FIG. 1F, the plurality of LED elements 102a in the mixing device 106 are randomly distributed on another carrier 107 to form a carrier combination. In an embodiment, the carrier combination includes a positioning layer 108 on the carrier 107. The positioning layer 108 is provided with recesses 110 to receive the LED elements 102a. Some of the LED elements 102a may enter the recesses 110 and be positioned. However, the positioning mechanism of the LED elements 102a is not limited to the described embodiment. For example, in some embodiments, the LED elements 102a may be positioned by magnetic force.

In addition, since the LED elements 102a have N-type layers and P-type layers, the N-type layers or the P-type layers of the LED elements 102a may be controlled to all face upward by an auxiliary step, or not controlled to maintain the mixed state thereof. If the N-type layers or the P-type layers are controlled to face upward, electrodes do not need to subsequently adopt a symmetrical electrode structure, and the area occupied by the structure can be reduced.

Referring to FIG. 1G, the additional LED elements 102a that are not in the recesses 110 are removed, and the LED elements 102a in the recesses 110 are kept on the carrier 107.

Referring to FIG. 1H, another carrier 112 bonds with the LED elements 102a, for example, by using adhesive such as epoxy, silicone, acrylic, siloxane, photoresists, heat curing materials, other suitable materials, or the combination thereof (not shown). However, the disclosure is not limited thereto.

Referring to FIG. 1I, the LED elements 102a are separated from the positioning layer 108 on the carrier 107 in a chemical process, a laser removing process or a heating process. The LED elements 102a turn to be adhered to the carrier 112.

Referring to FIG. 1J, to manufacture LED chips 200, a mesa process is further performed, and electrodes and/or other function layers formed on the LED elements 102a on the carrier 112. Herein, the mesa process is performed to expose surfaces of the N-type layers and the P-type layers. Using one LED chip 200 as an example, the LED element 102a of the LED chip 200 includes a buffer layer 102_1, a first conductive layer 102_2, a quantum well layer 102_3, and a second conductive layer 102_4. The first conductive layer 102_2 and the quantum well layer 102_3 are partially removed to expose the second conductive layer 102_4, and at least a pair of electrodes 114 may be respectively disposed on the first conductive layer 102_2 and the second conductive layer 102_4. To be more specific, one of the first conductive layer 102_2 and the second conductive layer 102_4 is a N-type layer, and another one of the first conductive layer 102_2 and the second conductive layer 102_4 is a P-type layer, and at least one electrode is formed to electrically connect to one of the N-type layer and the P-type layer, and another electrode or other electrodes are formed to electrically connect to another one of the N-type layer and the P-type layer. In the disclosure, the pair of electrodes may be formed by a deposition process or a printing process, but the disclosure is not limited thereto. That is, an LED chip 200 may include one or more LED elements 102a, and at least a pair of electrodes 114 are formed on the LED elements 102a. However, the disclosure is not limited thereto, in some embodiments, an LED chip 200 may include several LED elements 102a firstly coupled together and only some or one of the LED elements 102a has the electrodes 114 formed thereon.

Referring to FIG. 1K, LED chips 200 manufactured on the carrier 112 are moved onto and bonded with another carrier 116, for example, by using adhesive such as epoxy, silicone, acrylic, siloxane, photoresists, heat curing materials, other suitable materials, or the combination thereof (not shown). However, the disclosure is not limited thereto.

Referring to FIG. 1L, the LED chips 200 on the carrier 116 are extracted, for example, by using a pickup device 118 and a bonding layer 120. It should be noted that bonding layer 120 is a layer that the LED chips can be attached on, and the LED chips may be attached by magnetic force, adhesive materials, vacuum, etc. The LED chips 200 may be separated from the carrier 116, for example, in a chemical process, a laser removing process, or a heating process.

Referring to FIG. 1M, the LED chips 200 on the pickup device 118 are placed on a driving substrate 122. A heating process may be performed to enable the LED chips 200 to be bonded on the driving substrate 122.

Referring to FIG. 1N, the pickup device 118 is then moved away, to complete the configuration of the LED chips 200 on the driving substrate 122. The combination of LED chips 200 and driving substrate 122 may be an electronic device, or at least a component of an electronic device.

Figure 2A:
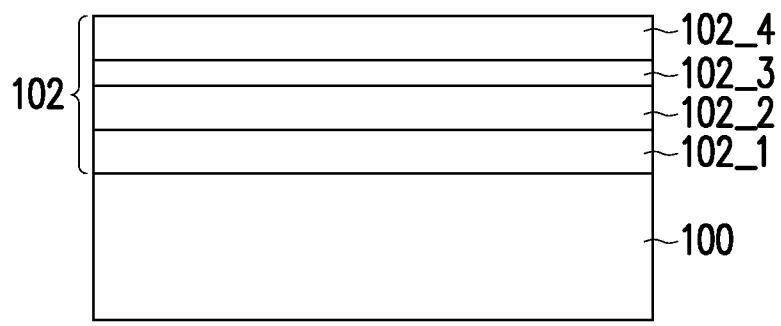
FIG. 2A and FIG. 2B are schematic cross-sectional structural diagrams of an epitaxial layer according to an embodiment of the disclosure.
Figure 2B:
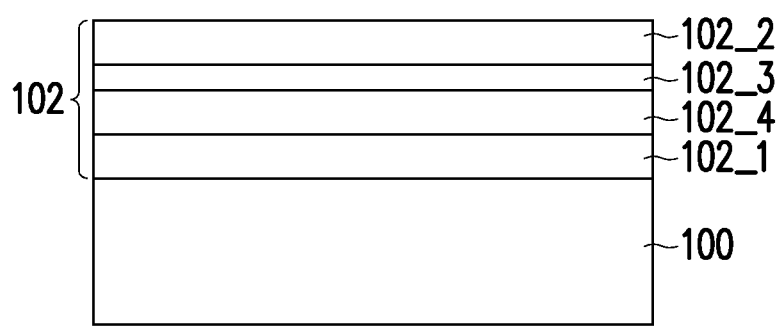

Referring to FIG. 2A and FIG. 2B, in some embodiments, the epitaxial layer 102 may be formed on the growth substrate 100 in different stack manners. FIG. 2A and FIG. 2B are schematic cross-sectional structural diagrams of an epitaxial layer according to some embodiments of the disclosure.

Referring to FIG. 2A, the epitaxial layer 102, for example, includes a buffer layer 102_1, a first conductive layer 102_2, a quantum well layer 102_3, and a second conductive layer 102_4. For example, the first conductive layer 102_2 is a P-type conductive layer, and the second conductive layer 102_4 is an N-type conductive layer. The P-type first conductive layer 102_2 is first formed on the buffer layer 102_1, and then the quantum well layer 102_3 and the N-type second conductive layer 102_4 are sequentially formed. Referring to FIG. 2B, a stack order of epitaxial layer 102 is from the buffer layer 102_1, the second conductive layer 102_4, and the quantum well layer 102_3 to the first conductive layer 102_2.

Herein, it should be noted that, when the epitaxial layer 102 is moved onto the carrier 107, the buffer layer 102_1 may face upward or downward. The buffer layer 102_1 is not doped, and cannot function as an N-type conductive layer or a P-type conductive layer. If the buffer layer 102_1 faces upward, the buffer layer 102_1 needs to be removed.

FIG. 3A to FIG. 3H are schematic cross-sectional structural diagrams of a process of manufacturing LED chips and an electronic device according to an embodiment of the disclosure.

Figure 3A:
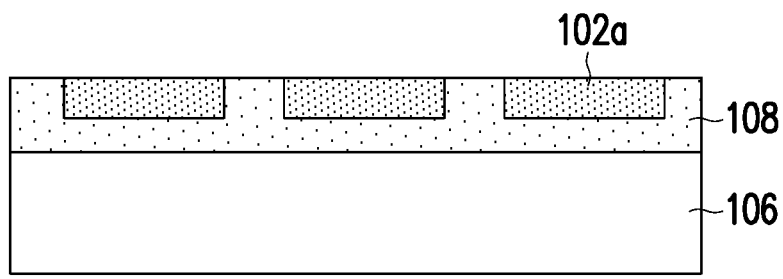
FIG. 3A to FIG. 3H are schematic cross-sectional structural diagrams of a process of manufacturing LED chips and an electronic device according to an embodiment of the disclosure.

Referring to FIG. 3A, FIG. 3A may correspond to a state in FIG. 1G. It should be noted that manufacturing process before a state in FIG. 3A may be referred to the manufacturing process from FIG. 1A to FIG. 1G, and the related descriptions are omitted herein.

Figure 3B:
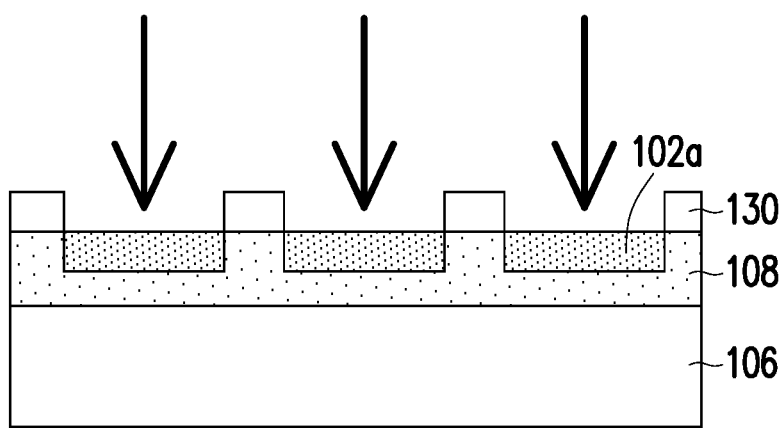
Figure 3C:
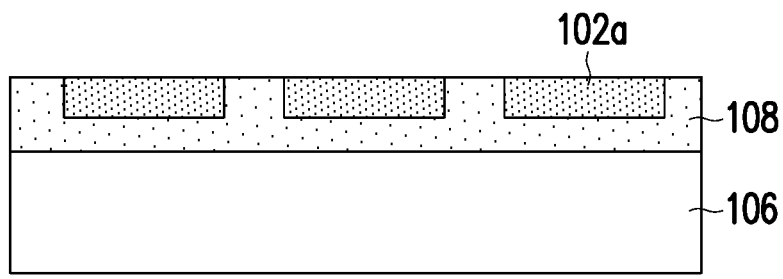

Referring to FIG. 3B and FIG. 3C, when the un-doped buffer layer 102_1 of the epitaxial layer 102 faces upward after the LED element 102a is placed on the positioning layer 108 and positioned, the buffer layer 102_1 of the LED element 102a is removed, for example, by processes of forming a photoresist layer 130, performing an etching process, and removing the photoresist layer 130. In this way, the first conductive layer 102_2 or the second conductive layer 102_4 is exposed as a top layer of the LED element 102a.

Figure 3D:
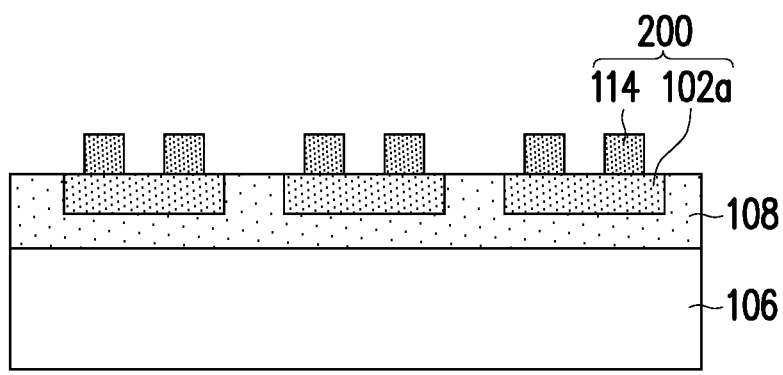

Referring to FIG. 3D, after the completion of the mesa process and forming the electrodes 114 according to the manufacturing process in FIG. 1J, the LED chips 200 may be formed on the positioning layer 108. In other words, different from FIG. 1F, the carrier combination may include a carrier 107, a positioning layer 108, and the LED chips 200 which have LED elements 102a and electrodes 114 on the positioning layer 108. In an embodiment, the positioning layer 108 does not need to be separated from the carrier 107.

Figure 3E:
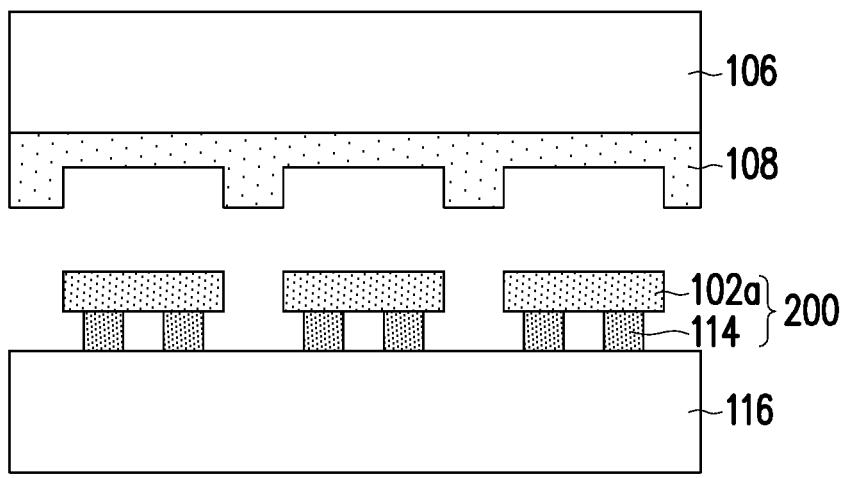

Referring to FIG. 3E, in an embodiment, the LED chips 200 on the carrier 107 are moved onto and bonded with another carrier 116, for example, by using adhesive such as epoxy, silicone, acrylic, siloxane, photoresists, heat curing materials, other suitable materials, or the combination thereof (not shown).

Figure 3F:
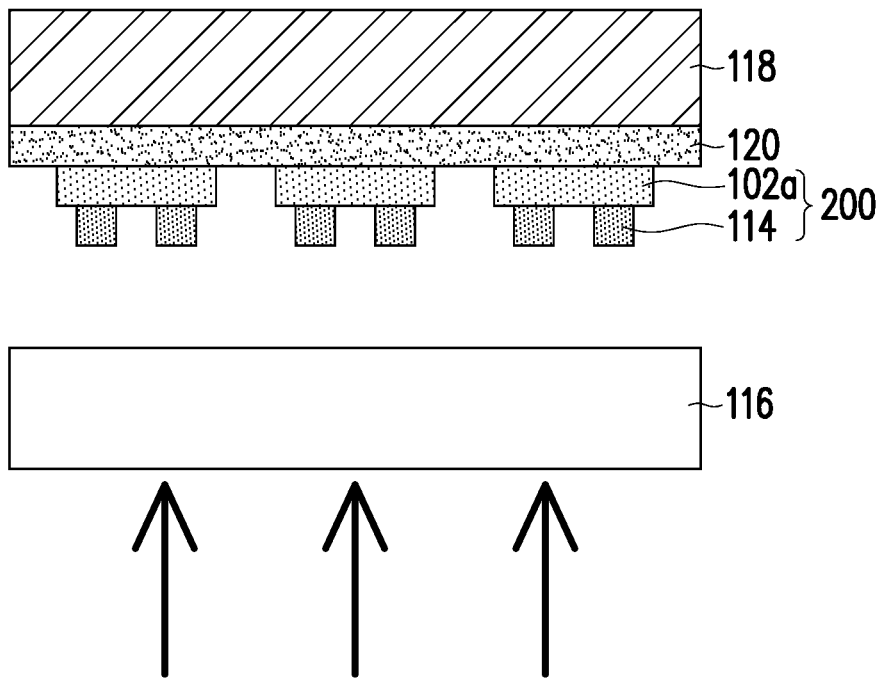

Referring to FIG. 3F, in the same manner in FIG. 1L, the LED chips 200 on the carrier 116 are extracted by using a pickup device 118 and a bonding layer 120. The LED chips 200 may be separated from the carrier 116, for example, in a chemical process, a laser removing process, or a heating process.

Figure 3G:
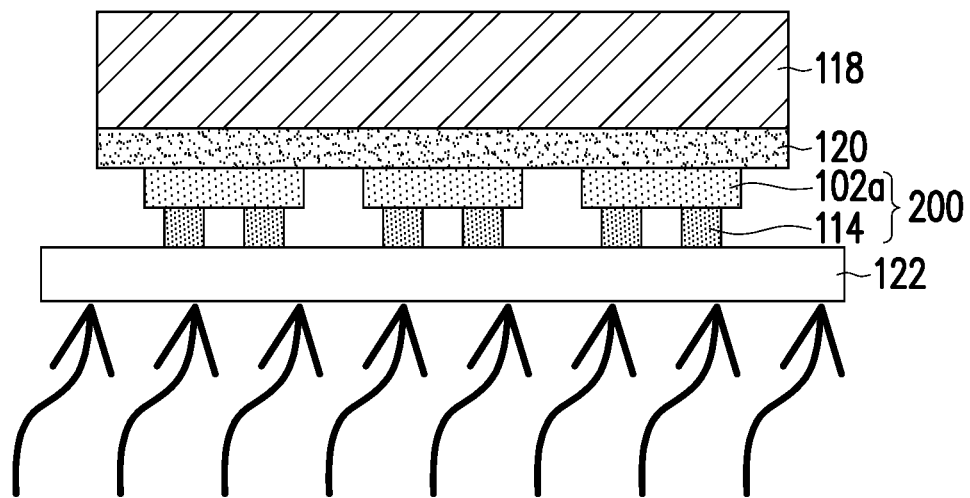

Referring to FIG. 3G, in the same manner in FIG. 1M, the LED chips 200 on the pickup device 118 are placed on a driving substrate 122. A heating process may be performed to enable the LED chips 200 to be bonded on the driving substrate 122.

Figure 3H:
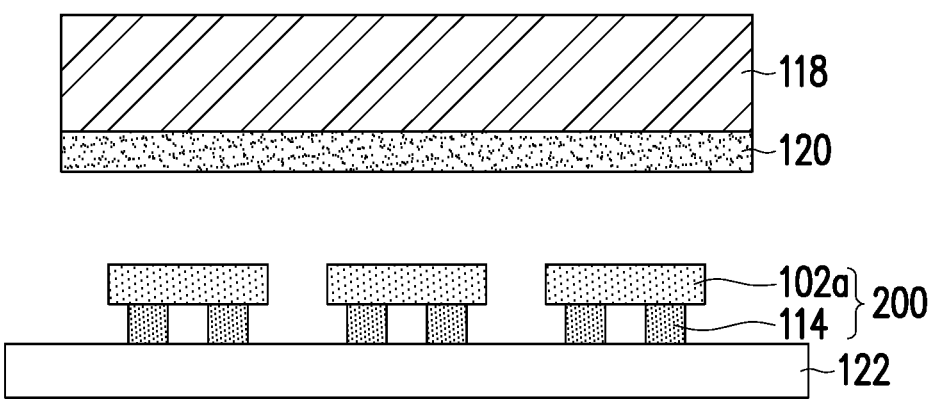

Referring to FIG. 3H, in the same manner in FIG. 1N, the pickup device 118 is moved away to complete the configuration of the LED chips 200 on the driving substrate 122. The combination of LED chips 200 and the driving substrate 122 may be an electronic device or a component of an electronic device.

Herein, in other embodiments, after the LED chips 200 are manufactured in FIG. 3D, if the carrier 107 is a flexible carrier, for example, the LED chips 200 may be adhered to the driving substrate 122 by using a roller mechanism.

Figure 4:
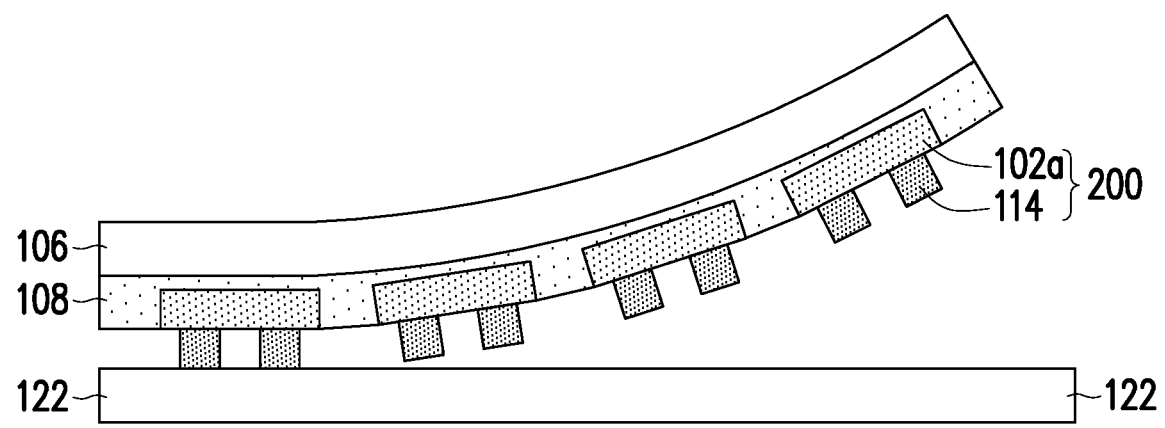
FIG. 4 is a schematic diagram of a roller configuration mechanism according to an embodiment of the disclosure.

FIG. 4 is a schematic diagram of a roller configuration mechanism according to an embodiment of the disclosure. Referring to FIG. 4, using the state in FIG. 3D as an example, the carrier 107 is flexible, and LED chips 200 on the carrier 107 may be adhered to a driving substrate 122 in by a roller.

To change the size or shape of LED chips, the manufacturing method in the disclosure may be further modified. FIG. 5A to FIG. 5D are schematic cross-sectional structural diagrams of a process of manufacturing LED chips according to an embodiment of the disclosure.

Figure 5A:
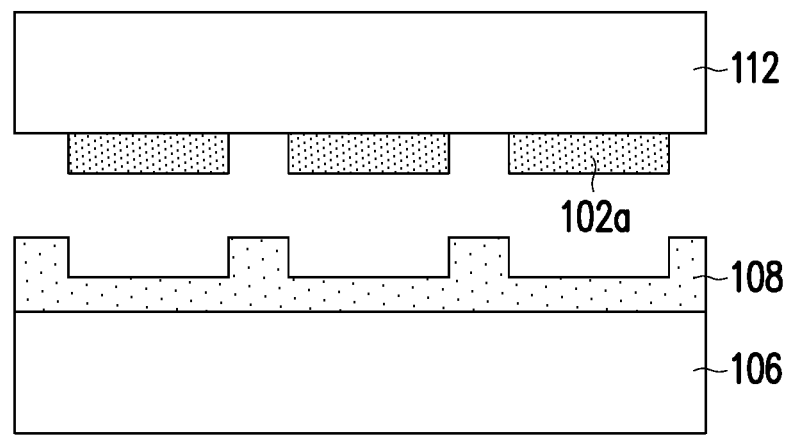
FIG. 5A to FIG. 5D are schematic cross-sectional structural diagrams of a process of manufacturing LED chips according to an embodiment of the disclosure.
Figure 5B:
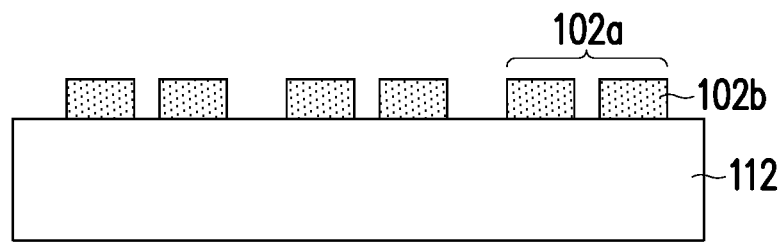

FIG. 5A corresponds to a state shown in FIG. 1I, and the description may refers to the description in FIG. 1I. Referring to FIG. 5B, LED elements 102a on a carrier 112 may be further divided into smaller LED elements 102b. The embodiment in FIG. 5B shows an example that all the LED elements 102a are divided, and in some embodiments, only some of the LED elements 102a are divided. Generally, N LED elements 102a are divided into M LED elements 102b. M and N are integers, and M>N.

In this stage, since the LED elements 102b are still epitaxial layer structures of a semiconductor, and the electrodes are not formed yet. Therefore, an alignment requirement for the dividing process is relatively low, making the dividing process easy.

Figure 5C:
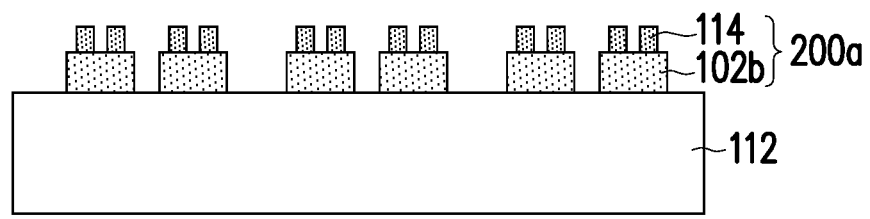

Referring to FIG. 5C, although the LED elements 102b are of a smaller size, a manner of forming LED chips 200a is still similar to the manner in FIG. 1J.

Figure 5D:
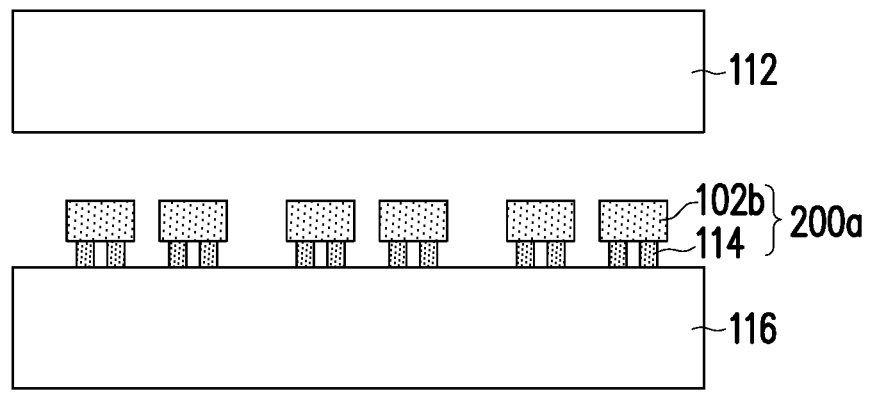

Referring to FIG. 5D, similar to the manner in FIG. 1K, the LED chips 200a on the carrier 112 are moved onto a carrier 116. Since the subsequent manufacturing process after FIG. 5D is similar to the manufacturing process from FIG. 1L to FIG. 1N. Details are not repeated herein.

In the foregoing embodiments of the manufacturing process, a plurality of described embodiments may be combined into some other embodiments. FIG. 6A to FIG. 6G are schematic cross-sectional structural diagrams of a process of manufacturing LED chips and an electronic device according to an embodiment of the disclosure.

Figure 6A:
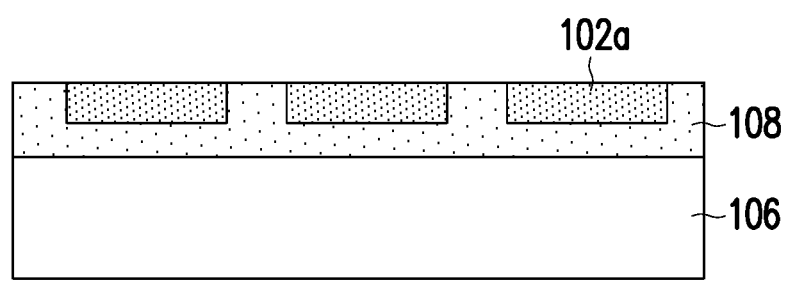
FIG. 6A to FIG. 6G are schematic cross-sectional structural diagrams of a process of manufacturing LED chips and an electronic device according to an embodiment of the disclosure.

Referring to FIG. 6A, FIG. 6A may correspond to the structure in FIG. 3C. A carrier 107, a positioning layer 108, and LED elements 102a are the same as the foregoing embodiments. Therefore, details are omitted herein.

Figure 6B:
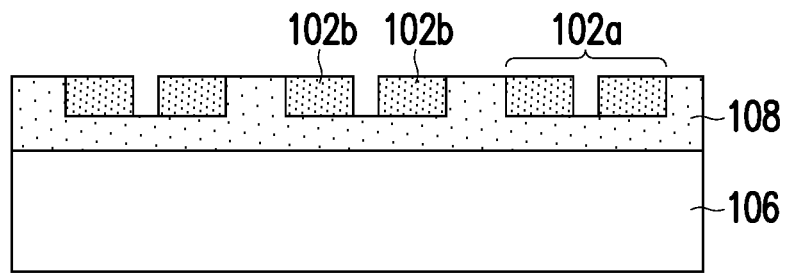

Referring to FIG. 6B, the LED elements 102a may be divided into LED elements 102b of a smaller size. Because the LED elements 102b are merely epitaxial layer structures of a semiconductor, and the electrodes are not formed yet, the process of dividing the LED elements 102a is easy.

Figure 6C:
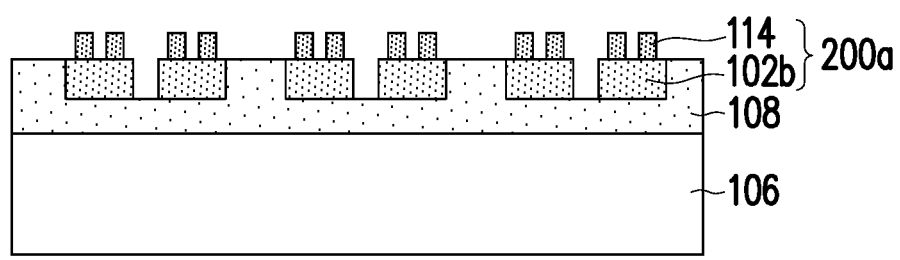

Referring to FIG. 6C, a mesa process is further performed and other function layers and/or electrodes are formed on the LED elements 102b, then LED chips 200a are manufactured. In this way, the LED chips 200b have a smaller size.

Figure 6D:
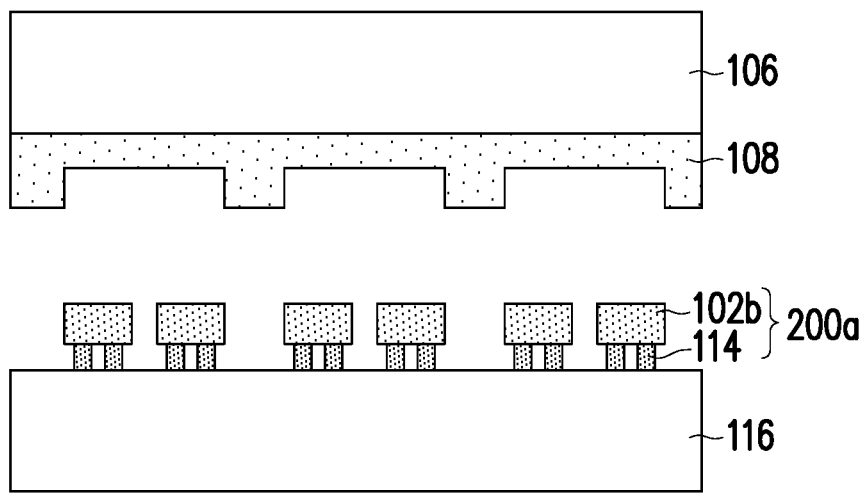

Referring to FIG. 6D, similar to the manner in FIG. 3E, the LED chips 200a on the carrier 107 are moved onto another carrier 116.

Figure 6E:
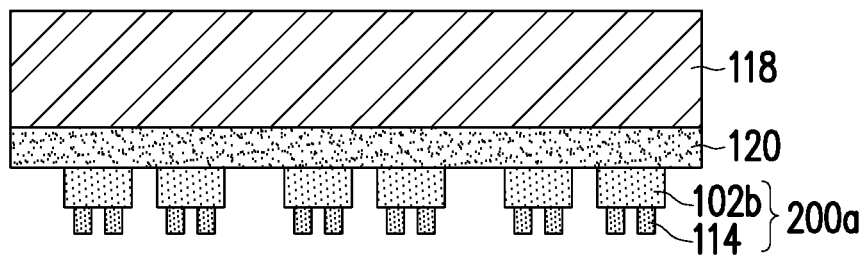
Figure 6E:
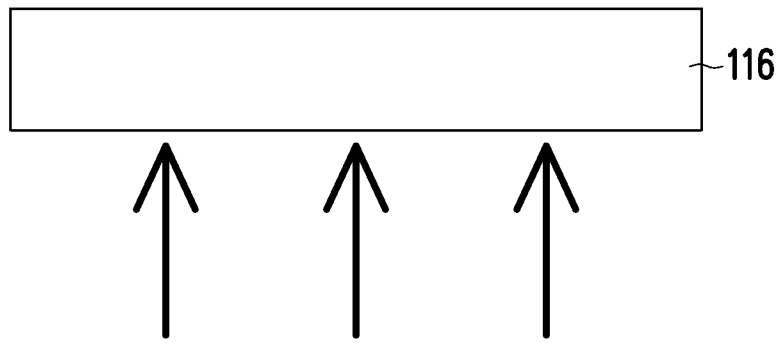

Referring to FIG. 6E, similar to the manner in FIG. 3F, the LED chips 200a are picked up from the carrier 116 by using a pickup device 118.

Figure 6F:
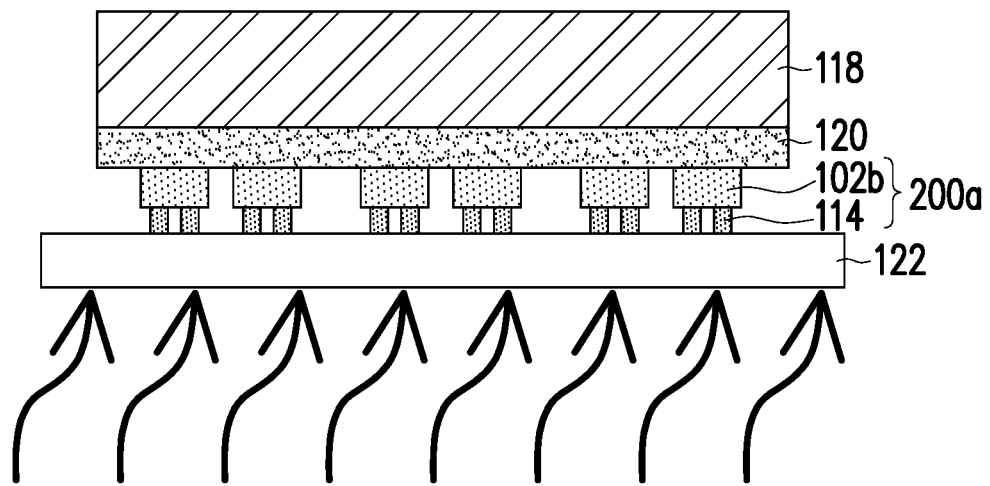

Referring to FIG. 6F, similar to the manner in FIG. 3F, the LED chips 200a picked up by the pickup device 118 are placed on a driving substrate 122. The LED chips 200 are bonded on the driving substrate 122, for example, through a heating process.

Figure 6G:
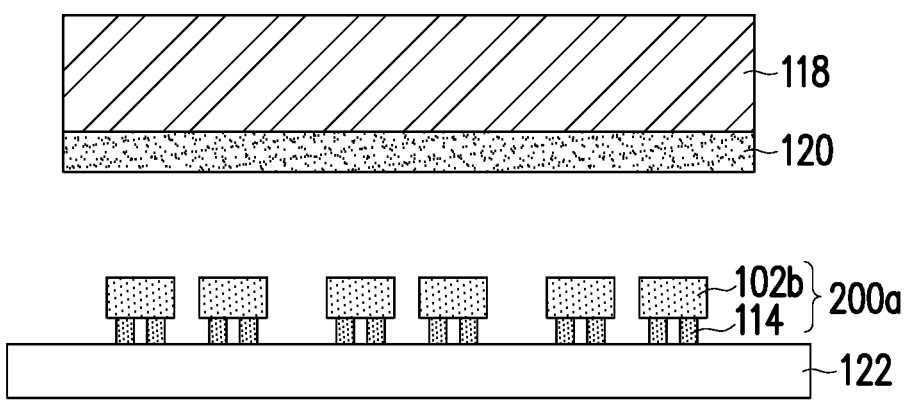

Referring to FIG. 6G, similar to the manner in FIG. 3H, after the pickup device 118 is removed, a combination of the driving substrate 122 and the LED chips 200a may be formed as an electronic device or a component of an electronic device.

As described above, in the disclosure, a plurality of LED elements are firstly made of an epitaxial layer. Then the LED elements are randomly mixed, and then positioned on a corresponding carrier to perform a subsequent process, such as mesa process and/or forming electrodes to manufacture LED chips. In some embodiments, the LED elements 102a may be further divided into smaller LED elements 102b, and then a subsequent process is performed to manufacture smaller LED chips 200a.

Further, as noted in FIG. 1B, due to the uneven properties of the epitaxial layer 102, the performance, such as luminance, of the plurality of LED elements 102a may be not uniform. However, the randomly mixing process and the rearrangement of LED elements 102a as shown in FIG. 1E and FIG. 1F may help the LED elements to be evenly distributed to reduce defects such as a mura phenomenon caused by the uneven properties may be reduced, and the image quality may be improved.

Although the embodiments and advantages of the disclosure have been disclosed above, it should be understood that, a person of ordinary skill in the art may make combinations, variations, replacements and modifications without departing from the spirit and scope of the disclosure. In addition, the protection scope of the disclosure is not limited to a process, machine, manufacturing, material composition, device, method, and step in a specific embodiment in this specification. A person of ordinary skill in the art may understand the existing or to-be-developed process, machine, manufacturing, material composition, device, method, and step from the content of the disclosure, which may be used according to the disclosure as long as the substantially same function can be implemented or the substantially same result can be obtained in the embodiments described herein. Therefore, the protection scope of the disclosure includes the foregoing process, machine, manufacturing, material composition, device, method, and step. In addition, the protection scope of the disclosure also includes a combination of claims and embodiments. The protection scope of the disclosure should be subject to the appended claims.

What is claimed is:

1. A method for manufacturing an LED chip, comprising:
providing a plurality of LED elements;
randomly mixing the plurality of LED elements;
after randomly mixing the plurality of LED elements, dividing the plurality of LED elements in a number of N into a number of M, wherein M and N are integers, and M>N;
performing a mesa process on the divided plurality of LED elements; and forming at least one pair of electrodes on the divided plurality of LED elements.

2. The method according to claim 1, wherein the plurality of LED elements is mixed in a mixing device, and the mixing device contains a liquid.

3. The method according to claim 1, wherein the pair of elect odes are formed by a deposition process.

4. The method according to claim 1, wherein the pair of electrodes are formed by a printing process.

5. The method according to claim 1, further comprising:
providing a growth substrate;
forming the plurality of LED elements on the growth substrate; and
removing the growth substrate.

6. The method according to claim 1, wherein the step of providing the plurality of LED elements comprises:
providing a growth substrate;
forming an epitaxial layer with a stack structure on the growth substrate;
dividing the epitaxial layer into the plurality of LED elements; and
separating the plurality of LED elements from the growth substrate.

7. The method according to claim 6, wherein the stack structure of the epitaxial layer and the plurality of LED elements includes an N-type layer, a P-type layer, and a multiple quantum well between the N-type layer and the P-type layer.

8. The method according to claim 7, wherein one of the at least one pair of electrodes is formed to electrically connect to one of the N-type layer and the P-type layer.

9. The method according to claim 7, wherein the multiple quantum well is partially removed before forming the at least one pair of electrodes on the plurality of LED element.

10. A earlier combination, comprising:
a carrier; and
an LED chip disposed on the carrier, wherein the LED chip is manufactured by the method according to claim 1.

11. The carrier combination according to claim 10, wherein the carrier combination includes a positioning layer, and the LED chip is formed on the positioning layer.

12. An electronic device, comprising:
a driving substrate; and
a LED chip bonded on the driving substrate, wherein the LED chips is manufactured by the method according to claim 1.

13. A method for manufacturing an electronic device, comprising:
providing a growth substrate;
forming an epitaxial layer with a stack structure on the growth substrate;
dividing the epitaxial layer into a plurality of LED elements;
separating the plurality of LED elements from the growth substrate;
randomly mixing the plurality of LED elements;
dividing the plurality of LED elements in a number of N into a number of M, wherein M and N are integers, and M>N;
after randomly mixing the plurality of LED elements, performing a mesa process on the divided plurality of LED elements;
forming a plurality of electrodes on the divided plurality of LED elements to form at least one LED chip; and
bonding the at least one LED chip on a driving substrate.

14. The method according to claim 13, wherein the plurality of LED elements is mixed in a mixing device, and the mixing device contains a liquid.

15. The method according to claim 13, wherein the pair of electrodes are formed by a deposition process.

16. The method according to claim 13, wherein the pair of electrodes are formed by a printing process.

17. The method according to claim 13, wherein the stack structure of the epitaxial layer and the plurality of LED elements includes an N-type layer, a P-type layer, and a multiple quantum well between the N-type layer and the P-type layer.

18. The method according to claim 17, wherein one of the at least one pair of electrodes is formed to electrically connect to one of the N-type layer and the P-type layer.

* * * * *